US008632634B2

(12) United States Patent
Moriyama et al.

(10) Patent No.: US 8,632,634 B2
(45) Date of Patent: Jan. 21, 2014

(54) COATING APPARATUS AND COATING METHOD

(75) Inventors: Yoshikazu Moriyama, Shizuoka (JP); Kunihiko Suzuki, Shizuoka (JP); Hironobu Hirata, Shizuoka (JP)

(73) Assignee: NuFlare Technology, Inc., Shizuoka (JP)

( * ) Notice: Subject to any disclaimer, the term of this patent is extended or adjusted under 35 U.S.C. 154(b) by 865 days.

(21) Appl. No.: 12/508,012

(22) Filed: Jul. 23, 2009

(65) Prior Publication Data

US 2010/0021631 A1 Jan. 28, 2010

(30) Foreign Application Priority Data

Jul. 24, 2008 (JP) ................................ 2008-191286

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl.
USPC ................ 118/715; 156/345.33; 156/345.34; 156/345.37

(58) Field of Classification Search
USPC ............ 118/715; 156/345.33–345.34, 345.37
See application file for complete search history.

(56) References Cited

U.S. PATENT DOCUMENTS

| | | | | |
|---|---|---|---|---|
| 5,091,207 A | * | 2/1992 | Tanaka | 427/8 |
| 5,501,739 A | * | 3/1996 | Yamada et al. | 118/719 |
| 5,565,038 A | * | 10/1996 | Ashley | 134/2 |
| 5,633,212 A | * | 5/1997 | Yuuki | 438/773 |
| 5,728,223 A | * | 3/1998 | Murakami et al. | 118/715 |
| 5,935,337 A | * | 8/1999 | Takeuchi et al. | 118/724 |
| 5,950,925 A | * | 9/1999 | Fukunaga et al. | 239/132.3 |
| 6,132,512 A | * | 10/2000 | Horie et al. | 118/715 |
| 6,176,929 B1 | * | 1/2001 | Fukunaga et al. | 118/715 |
| 6,281,141 B1 | * | 8/2001 | Das et al. | 438/770 |
| 6,387,182 B1 | * | 5/2002 | Horie et al. | 118/244 |
| 6,453,992 B1 | * | 9/2002 | Kim | 165/206 |
| 6,635,117 B1 | | 10/2003 | Kinnard et al. | |

(Continued)

FOREIGN PATENT DOCUMENTS

| | | |
|---|---|---|
| JP | 07-193003 | 7/1995 |
| JP | 2008-1923 | 1/2008 |

(Continued)

OTHER PUBLICATIONS

Notification of Reasons for Refusal issued by the Korean Patent Office on Apr. 12, 2011, for Korean Patent Application No. 2009-67230, and English-language translation thereof.

(Continued)

*Primary Examiner* — Rudy Zervigon

(74) *Attorney, Agent, or Firm* — Finnegan, Henderson, Farabow, Garrett & Dunner, L.L.P.

(57) ABSTRACT

In a coating apparatus, a distributor plate 104 is disposed upstream of a silicon wafer 101 relative to the direction of flow of reactive gas. The distributor plate 104 has therein first through-holes 104a and second through-holes 104b arranged so as not to meet the first through-holes 104a. The reactive gas passes through the first through-holes 104a and flows down toward the silicon wafer 101. Further, a cooling gas passes through the second through-holes 104b.

6 Claims, 6 Drawing Sheets

(56) References Cited

U.S. PATENT DOCUMENTS

| | | | |
|---|---|---|---|
| 7,273,526 B2* | 9/2007 | Shinriki et al. | 118/715 |
| 7,408,225 B2* | 8/2008 | Shinriki et al. | 257/359 |
| 7,618,493 B2* | 11/2009 | Yamada et al. | 118/715 |
| 7,771,535 B2* | 8/2010 | Koyanagi | 118/715 |
| 7,845,309 B2* | 12/2010 | Condrashoff et al. | 118/723 E |
| 7,886,687 B2* | 2/2011 | Lee et al. | 118/723 E |
| 7,918,938 B2* | 4/2011 | Provencher et al. | 118/715 |
| 7,959,816 B2* | 6/2011 | Sato | 216/13 |
| 7,967,912 B2* | 6/2011 | Yajima et al. | 118/730 |
| 8,069,817 B2* | 12/2011 | Fischer et al. | 118/723 E |
| 2002/0192369 A1 | 12/2002 | Morimoto et al. | 427/248.1 |
| 2003/0047282 A1* | 3/2003 | Sago et al. | 156/345.34 |
| 2004/0050326 A1* | 3/2004 | Thilderkvist et al. | 118/715 |
| 2004/0216668 A1* | 11/2004 | Lindfors et al. | 118/715 |
| 2005/0016455 A1* | 1/2005 | Cho et al. | 118/723 E |
| 2005/0059246 A1* | 3/2005 | Yamada et al. | 438/689 |
| 2005/0208217 A1* | 9/2005 | Shinriki et al. | 427/248.1 |
| 2005/0229848 A1* | 10/2005 | Shinriki et al. | 118/715 |
| 2006/0137820 A1* | 6/2006 | Lee et al. | 156/345.37 |
| 2006/0162661 A1* | 7/2006 | Jung et al. | 118/723 ER |
| 2006/0234514 A1* | 10/2006 | Gianoulakis et al. | 438/758 |
| 2007/0289604 A1* | 12/2007 | Fukunaga et al. | 134/3 |
| 2008/0053614 A1* | 3/2008 | Sago et al. | 156/345.33 |
| 2008/0156440 A1* | 7/2008 | Sago et al. | 156/345.34 |
| 2008/0245478 A1* | 10/2008 | Hotta et al. | 156/345.29 |
| 2009/0142933 A1* | 6/2009 | Yajima et al. | 438/758 |
| 2009/0151639 A1* | 6/2009 | Kasai et al. | 118/724 |
| 2009/0217878 A1* | 9/2009 | Levy et al. | 118/729 |
| 2009/0229754 A1* | 9/2009 | Iizuka et al. | 156/345.34 |
| 2009/0236041 A1* | 9/2009 | Iizuka | 156/345.34 |
| 2010/0021631 A1* | 1/2010 | Moriyama et al. | 427/255.23 |

FOREIGN PATENT DOCUMENTS

| | | |
|---|---|---|
| JP | 2009-141343 | 6/2009 |
| JP | 2009-231558 | 10/2009 |
| KR | 10-0587628 | 5/2006 |
| KR | 10-0587628 | 6/2006 |

OTHER PUBLICATIONS

Examination Opinion Notice mailed Nov. 22, 2012, from the Economic Department Intellectual Property Office of the Republic of China ("Taiwan") in corresponding Taiwanese Pat. App. No. 098124567, and English translation thereof (11 pages total).

Notification of Reasons for Refusal mailed Dec. 11, 2012, from the Japanese Patent Office in corresponding Japanese Patent Application No. 2008-191286, and English translation (6 pages total).

Notification of Reasons for Refusal, dated Mar. 26, 2013, from the Korean Intellectual Property Office in counterpart Korean Pat. App. No. KR 10-2009-0067230, and English translation thereof (9 pages total).

* cited by examiner

COATING APPARATUS AND COATING METHOD

BACKGROUND OF THE INVENTION

1. Field of the Invention

The present invention relates to a coating apparatus and a coating method.

2. Background Art

Coating apparatus of the single wafer processing type is commonly used to manufacture an epitaxial wafer, which is a wafer with a single crystalline film of silicon, etc. grown thereon.

A common coating apparatus of the single wafer processing type includes a chamber, gas supply means, wafer heating means, etc. The chamber contains a susceptor for supporting a wafer, and this susceptor can be rotated by a motor. In such a coating apparatus, the wafer placed on the susceptor is heated by wafer heating means while being rotated, with the wafer heating means being disposed above and below the susceptor. At that time, a reactive gas is supplied through the gas supply means to form an epitaxial film uniformly on the wafer.

In order that the epitaxial film formed on the wafer may be uniform in electrical characteristics, etc. across the entire surface of the wafer, it is necessary to equalize the flow of gas in the chamber. To achieve this, a distributor plate (or shower head) of quartz is provided at the top of the chamber so that the reactive gas supplied from the gas supply means is uniformly applied over the surface of the wafer.

Incidentally, it has been found that the formation of a thick epitaxial film on the wafer is accompanied by the formation of a film on the surface of the distributor plate, since the increased processing time results in an increase in the temperature of the distributor plate due to the radiant heat. If this film peels or flakes off, the flakes cause a reduction in the manufacturing yield of the epitaxial wafer. Furthermore, this film formed on the surface of the distributor plate interferes with the measurement of the wafer temperature by a radiation thermometer disposed at the top of the chamber.

Japanese Laid-Open Patent Publication No. 2008-1923 discloses a coating apparatus which includes a cooling unit for cooling the distribution plate (or shower head). The cooling unit includes a disc-shaped base and a large number of fins extending upward from the top surface of the base. A cooling gas is flowed along these cooling fins on the surface of the base to cool them.

Thus, in the coating apparatus disclosed in this publication, a cooling unit is provided on a member serving as a distributor plate and is cooled thereby cooling the adjacent distributor plate. That is, the distributor plate is indirectly cooled only from one side, meaning that it takes considerable time to cool the entire distributor plate. Therefore, this cooling construction may not be able to sufficiently cool the distributor plate if there is a significant rise in the temperature of the distributor plate, resulting in inability to prevent the formation of a film on the plate.

Further, for example, the distributor plate may be closely spaced from the wafer to increase the reaction efficiency over the surface of the wafer when a film is formed thereon. In such a case, the side of the distributor plate that faces the wafer is heated to a higher temperature than the other opposing side. In the construction of the above publication, however, since the cooling unit is disposed on the side of the distributor plate opposite that facing the wafer, the unit may not be able to sufficiently reduce the temperature rise of the distributor plate. The same problem arises when the wafer heating means is provided at the top of the chamber and the cooling unit is disposed on the side of the distributor plate that faces the wafer. Specifically, in this case, since the distributor plate is disposed between the wafer heating means and the wafer, the side of the distributor plate opposite that facing the wafer is heated to a higher temperature. This means that also in this construction the cooling unit may not be able to sufficiently reduce the temperature rise of the distributor plate.

In the coating apparatus disclosed in the above publication, the cooling unit is made of aluminum. Therefore, in order to measure the temperature of the wafer using the radiation thermometer disposed at the top of the chamber, the cooling unit must be disposed so as not to interfere with this measurement by the thermometer.

Further, this coating apparatus is also disadvantageous in that the cooling unit has a complicated structure since the cooling gas flows along the cooling fins on the surface of the base.

The present invention has been made in view of these problems. It is, therefore, an object of the present invention to provide a coating apparatus constructed such that the measurement of the wafer temperature is facilitated and the temperature rise of the distributor plate is sufficiently reduced.

Another object of the present invention is to provide a coating apparatus which has a simple structure, yet in which the temperature rise of the distributor plate is reduced.

Still another object of the present invention is to provide a coating method capable of forming a film while sufficiently reducing the temperature rise of the distributor plate.

SUMMARY OF THE INVENTION

According to one aspect of the present invention, a coating apparatus in which a film is formed on a surface of a substrate placed in a coating chamber by supplying a reactive gas to the inside of the coating chamber and heating the substrate, comprises a distributor plate disposed upstream of the substrate relative to the direction of flow of the reactive gas. A cooling gas passes through the inside of the distributor plate.

According to another aspect of the present invention, a coating apparatus in which a film is formed on a surface of a substrate placed in a coating chamber by supplying a reactive gas to the inside of the coating chamber and heating the substrate, comprises a distributor plate disposed upstream of the substrate relative to the direction of flow of the reactive gas and including two flat plates and a connecting pipe. The two flat plates have through-holes therein and are spaced a predetermined distance from each other. The connecting pipe is connected between the through-holes. The reactive gas passes through the inside of the connecting pipe and flows down toward the substrate. The cooling gas passes through between the two flat plates.

According to other aspect of the present invention, a coating apparatus in which a film is formed on a surface of a substrate placed in a coating chamber by supplying a reactive gas to the inside of the coating chamber and heating the substrate, comprises a distributor plate disposed upstream of the substrate relative to the direction of flow of the reactive gas and including a first portion having a plurality of through-holes therein and a hollow second portion disposed along the periphery of the first portion. The reactive gas passes through the through-holes and flows down toward the substrate. The cooling gas passes through the second portion.

According to other aspect of the present invention, in a coating method that supplies a reactive gas to the inside of a coating chamber and heats a substrate placed in the coating chamber to form a film on a surface of the substrate, a distributor plate is provided upstream of the substrate relative to the direction of flow of the reactive gas. The distributor plate has a through-hole therein. The reactive gas passes through the through-hole in the distributor plate so that the reactive gas flows down toward the substrate while flowing the cooling gas through the inside of the distributor plate.

Other objects and advantages of the present invention will become apparent from the following description.

DETAILED DESCRIPTION OF THE EMBODIMENTS

First Embodiment

Figure 1:
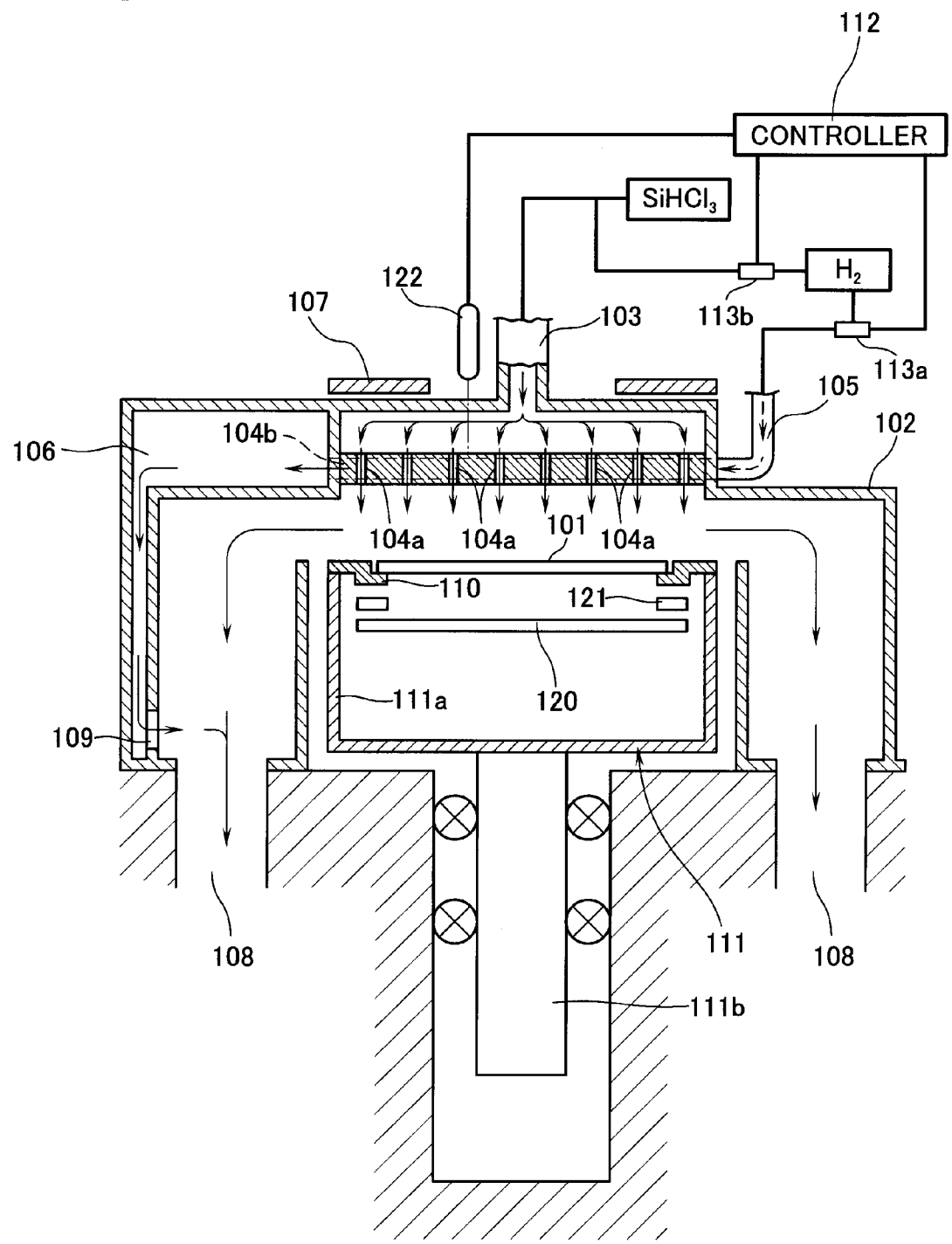
FIG. 1 is a schematic cross-sectional view of a coating apparatus according to a first embodiment of the present invention.

FIG. 1 is a schematic cross-sectional view of a coating apparatus of the single wafer processing type according to a first embodiment of the present invention. The substrate of the present embodiment described herein is a silicon wafer 101. However, the embodiment is not limited to this particular substrate, but may be applied to wafers of other suitable material depending on the application intended.

The coating apparatus 100 includes a chamber 102 serving as a coating chamber.

A reactive gas supply path (or first flow path) 103 is connected to the top of the chamber 102 to supply a reactive gas to the surface of the heated silicon wafer 101 in order to form a crystalline film thereon. According to the present embodiment, the reactive gas may be trichlorosilane and is mixed with hydrogen gas serving as a carrier gas. The gas mixture is introduced into the chamber 102 through the reactive gas supply path 103.

A distributor plate 104 is disposed upstream of the silicon wafer 101 relative to the direction of flow of the reactive gas (indicated by arrows in FIG. 1). The distributor plate 104 has a large number of first through-holes 104a therein, and the reactive gas supplied from the reactive gas supply path 103 passes through the first through-holes 104a and flows down toward the silicon wafer 101.

The distributor plate 104 also has second through-holes 104b therein, and hydrogen gas serving as a cooling gas is passed through these second through-holes 104b. Thus this embodiment is characterized in that a cooling gas passes through the inside of the distributor plate 104.

Figure 2:
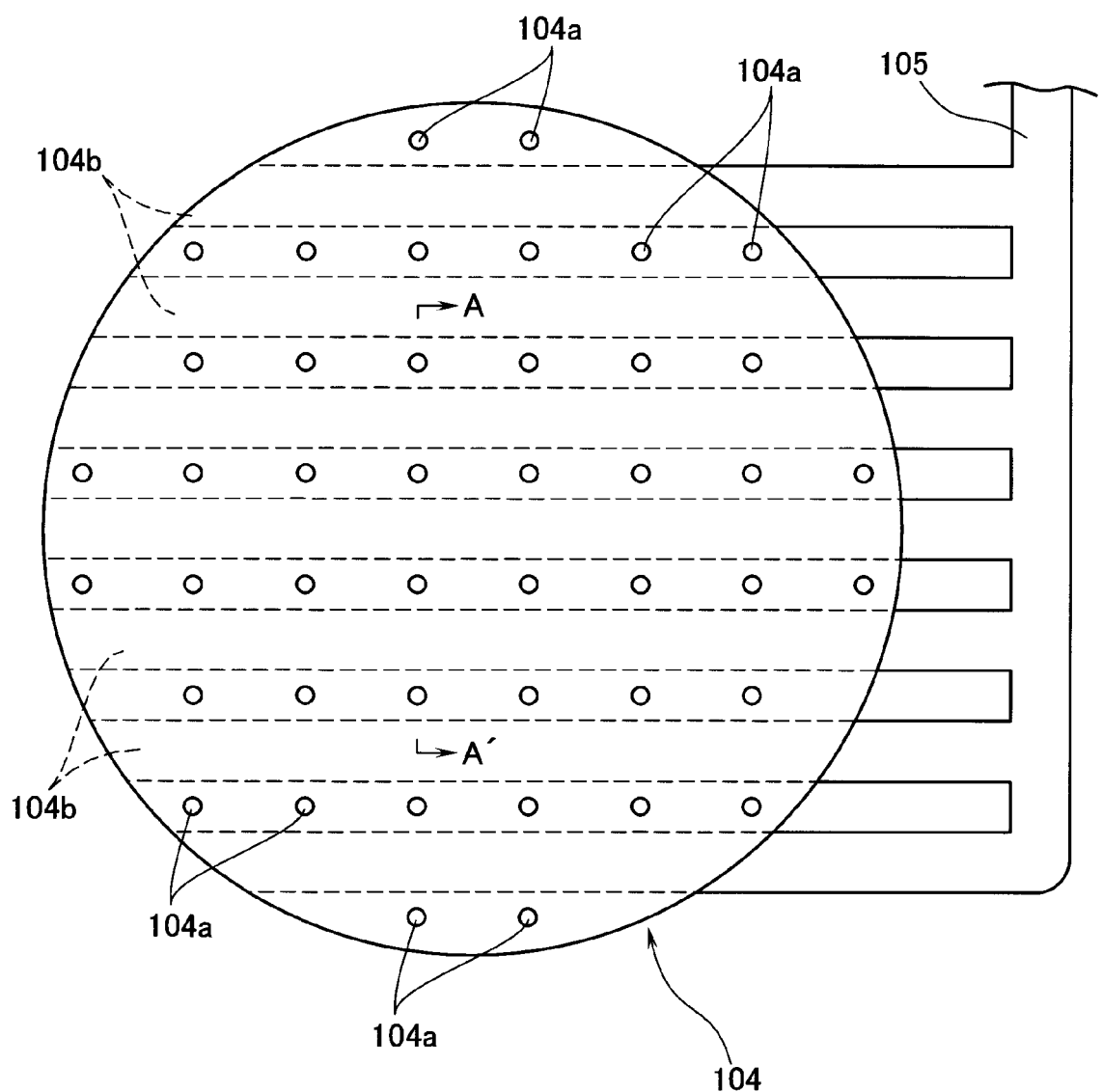
FIG. 2 is a plan view of a distributor plate of the first embodiment.
Figure 3:
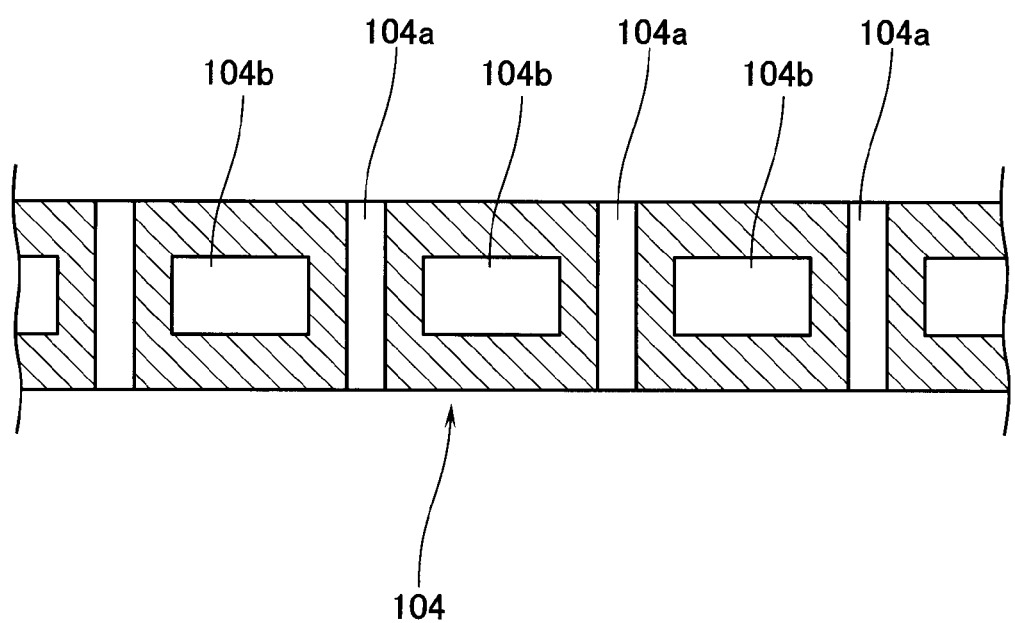
FIG. 3 is a cross-sectional view of a portion of the distributor plate taken along line A-A' of FIG. 2.
Figure 4:
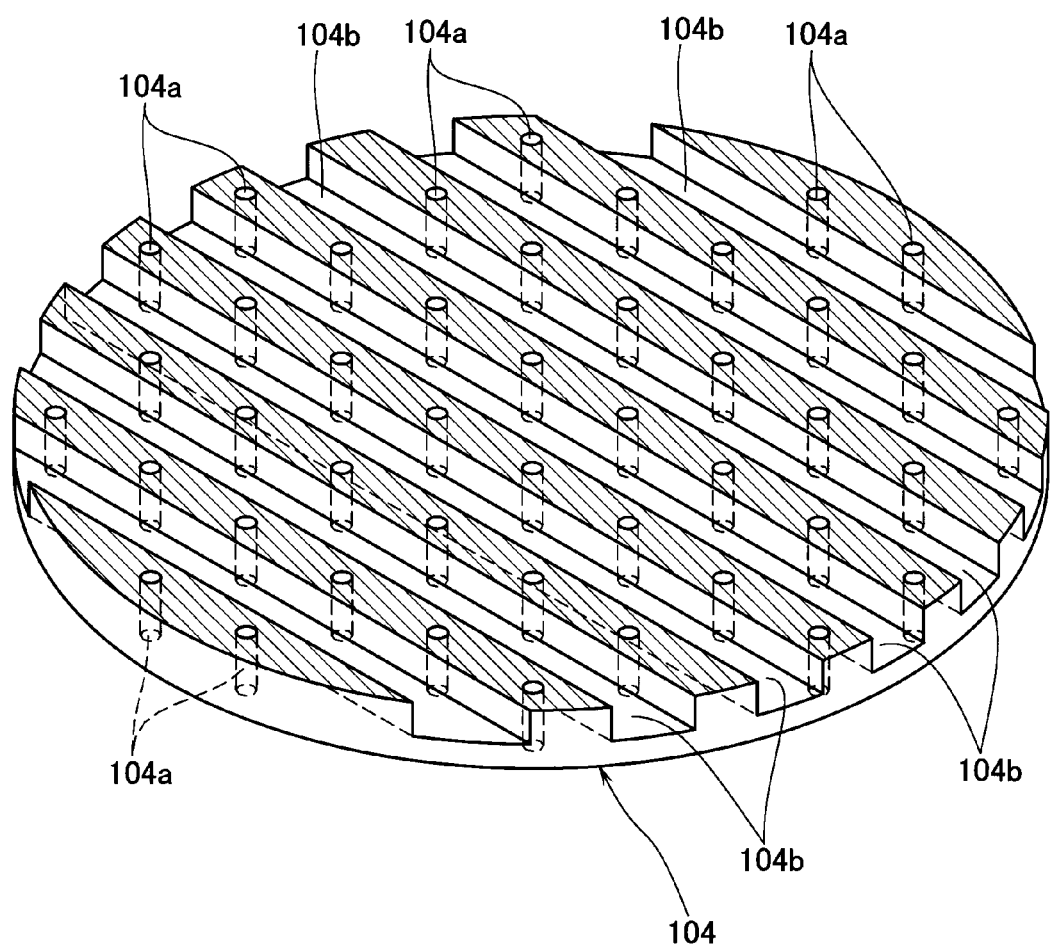
FIG. 4 is a perspective view of a cross section of the distributor plate taken along a plane parallel to the surface of the paper of FIG. 2.

FIG. 2 is a plan view of the distributor plate. FIG. 3 a cross-sectional view of a portion of the distributor plate taken along line A-A' of FIG. 2. Further, FIG. 4 is a perspective view of a cross section of the distributor plate taken along a plane parallel to the surface of the paper of FIG. 2. As shown in these figures, the distributor plate 104 has the first through-holes 104a, which extend in the direction of the reactive gas flow, and the second through-holes 104b arranged so as not to meet the first through-holes 104a. The reactive gas supplied from the reactive gas supply path 103 passes through the first through-holes 104a and flows down toward the silicon wafer 101. The cooling gas, on the other hand, passes through the second through-holes 104b.

The cooling gas is supplied from a cooling gas supply path (or second flow path) 105 and passes through the second through-holes 104b and exits into a first exhaust pipe (or third flow path) 106. The cooling gas may be hydrogen, nitrogen, or argon. However, it is preferably hydrogen in order to increase the cooling efficiency.

Since the cooling gas passes through the inside of the distributor plate 104, the distributor plate 104 is cooled directly. This makes it possible to sufficiently cool the distributor plate 104 in a short time. Further, since the distributor plate 104 is internally cooled, this cooling can be effective regardless of on which side of the plate the heat source is located.

For example, in FIG. 1, the chamber 102 contains first heating means (including an inner heater 120 and an outer heater 121) for heating the silicon wafer 101 by application of heat to its back surface. Further, second heating means 107 is provided outside the chamber 102 to heat the silicon wafer 101 by application of heat to its top surface. The heating by these heating means promotes the reaction on the surface of the silicon wafer 101 but results in an increase in the temperature of the distributor plate 104. However, according to the present embodiment, a cooling gas is passed through the inside of the distributor plate 104, so that the distributor plate 104 is directly cooled internally, thereby sufficiently reducing its temperature rise.

The cooling gas may be introduced into the distributor plate 104 at the same time as the reactive gas, or alternatively it may be introduced when the temperature of the distributor plate 104 has reached or exceeded a predetermined temperature. In the latter case, since it is considered that the temperature, or temperature rise, of the distributor plate 104 is proportional to that of the silicon wafer 101, the cooling gas may be introduced when the temperature of the silicon wafer 101 has reached or exceeded a predetermined temperature.

The supply of cooling gas can be shut off at the same time that the supply of reactive gas is shut off, or alternatively it may be shut off when the temperature of the distributor plate 104 (or silicon wafer 101) has fallen below a predetermined temperature.

The cooling gas is introduced at a suitable flow rate and at ambient temperature. Specifically, if the flow rate of cooling gas is too low, the cooling efficiency is reduced. If, on the other hand, the flow rate of cooling gas is too high, the cooling gas flow interferes with the discharge of the reactive gas and the cooling gas is wasted, resulting in increased cost.

The flow rate of the cooling gas may be maintained constant, or alternatively it may be varied in accordance with the temperature of the distributor plate 104 (or silicon wafer 101). Specifically, the flow rate of the cooling gas may be increased when the temperature of the distributor plate 104 (or silicon wafer 101) is equal to or higher than a predetermined temperature; and the flow rate of the cooling gas may be decreased when the temperature of the distributor plate 104 (or silicon wafer 101) is lower than the predetermined temperature. In order to save on the amount of cooling gas used, it is preferable to vary the flow rate of the cooling gas in accordance with the temperature of the distributor plate 104 (or silicon wafer 101).

Referring to FIG. 1, a second exhaust pipe (or fourth flow path) 108 is provided at the bottom of the chamber 102. The second exhaust pipe 108 is connected to a vacuum pump (not shown) and used to exhaust the unreacted reactive gas from the chamber 102. Further, the cooling gas discharged from the distributor plate 104 into the first exhaust pipe 106 is also exhausted through the second exhaust pipe 108. That is, the cooling gas introduced into the first exhaust pipe 106 passes through an opening 109 into the chamber 102 and is quickly exhausted from the coating apparatus 100 through the second exhaust pipe 108. It should be noted that if the flow rate of cooling gas is too high, it may affect the flow of reactive gas and interfere with the exhaust of the reactive gas. Therefore, the flow rate of cooling gas must be such that a sufficient cooling effect is obtained without interfering with the exhaust of the reactive gas.

In the chamber 102, a susceptor 110 on which the silicon wafer 101 is placed is disposed on a rotating portion 111. The rotating portion 111 includes a cylindrical portion 111a and a rotating shaft 111b. The rotating shaft 111b is rotated by a motor (not shown) to rotate the cylindrical portion 111a and the susceptor 110 mounted thereon.

An inner heater 120 and an outer heater 121 are provided in the cylindrical portion 111a to heat the silicon wafer 101 by application of heat to its back surface. A radiation thermometer 122 mounted at the top of the chamber 102 is used to measure the surface temperature of the silicon wafer 101, which temperature varies in response to the heat applied to the wafer. Therefore, the chamber 102 and the distributor plate 104 are preferably made of quartz. This ensures that the chamber 102 and the distributor plate 104 do not interfere with the temperature measurement by the radiation thermometer 122. The measured temperature data is sent to a controller 112. The controller 112 controls the operation of a valve 113a and a valve 113b provided in the hydrogen gas flow path. Specifically, when the temperature of the silicon wafer 101 has reached or exceeded a predetermined temperature, the controller 112 operates the valve 113a so that the hydrogen gas flows through the cooling gas supply path 105 as well as through the reactive gas supply path 103. It should be noted that the controller 112 also controls the output of the inner and outer heaters 120 and 121, though not shown in FIG. 1.

A coating method of the present invention will now be described.

This method forms a silicon epitaxial film on the silicon wafer 101 and includes the following steps.

First, the silicon wafer 101 is transferred into the chamber 102. The silicon wafer 101 is then placed on the susceptor 110 and rotated at approximately 50 rpm by rotating the rotating portion 111.

Next, the inner and outer heaters 120 and 121, serving together as the first heating means, and the second heating means 107 are activated to heat the silicon wafer 101. It should be noted that the silicon wafer 101 may be heated by only one of the first and second heating means. For example, the silicon wafer 101 is gradually heated to the deposition temperature, namely, 1150° C. After the temperature of the silicon wafer 101 as measured by the radiation thermometer 122 has reached 1150° C., the speed of rotation of the silicon wafer 101 is gradually increased. Then, a reactive gas is supplied from the reactive gas supply path 103 so that the gas flows down through the distributor plate 104 onto the silicon wafer 101.

The radiation thermometer 122 continues to measure the temperature of the silicon wafer 101. After the temperature of the silicon wafer 101 has reached a predetermined temperature, the controller 112 activates the valve 113a so that the hydrogen gas flows through the cooling gas supply path 105 as well as through the reactive gas supply path 103. As a result, a cooling gas (i.e., hydrogen gas) flows through the inside of the distributor plate 104, thereby limiting the temperature rise of the distributor plate 104 and preventing the formation of a film thereon. It should be noted that the cooling gas may be introduced into the distributor plate 104 at the same time as the reactive gas. Further, the flow rate of the cooling gas may be maintained constant, or alternatively it may be varied in accordance with the temperature of the silicon wafer 101.

The supply of reactive gas is shut off after forming an epitaxial film on the silicon wafer 101 to the desired thickness. The supply of cooling gas can be shut off at the same time that the supply of reactive gas is shut off, or alternatively the supply of cooling gas may be shut off when the temperature of the silicon wafer 101, as measured by the radiation thermometer 122, has fallen below a predetermined temperature. The silicon wafer 101 is then transferred out of the chamber 102 after making sure that the wafer has been cooled to a predetermined temperature.

As described above, the coating apparatus of the present embodiment is constructed such that a cooling gas passes through the inside of the distributor plate, thus efficiently cooling the entire plate. This arrangement also allows the temperature rise of the distributor plate to be reduced regardless of the location of the heating means. Further, the distributor plate may be made of quartz so as not to interfere with the measurement by the radiation thermometer.

Second Embodiment

Figure 5:
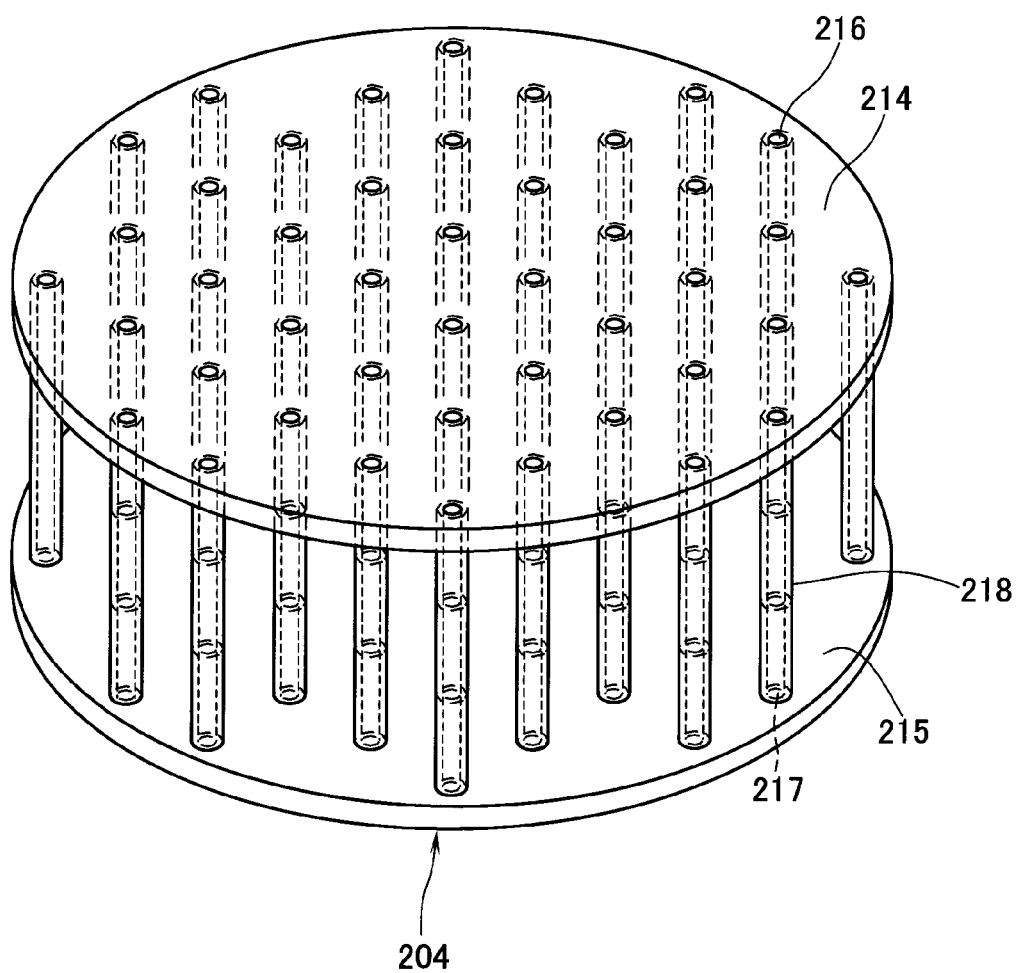
FIG. 5 is a perspective view of a distributor plate according to a second embodiment of the invention.

FIG. 5 is a perspective view of a distributor plate according to a second embodiment of the present invention. It should be noted that the configuration and components of the coating apparatus described below except for the distributor plate may be similar to those shown in FIG. 1 described in connection with the first embodiment.

The distributor plate (204) of the present embodiment is disposed upstream of the silicon wafer 101 relative to the direction of flow of reactive gas (indicated by arrows in FIG. 1).

As shown in FIG. 5, the distributor plate 204 includes two flat plates 214 and 215 spaced a predetermined distance from each other and having through-holes 216 and 217, respectively, therein, and also includes connecting pipes 218 connected between the through-holes 216 and 217. Referring now to FIG. 1, the reactive gas supplied from the reactive gas supply path 103 enters the chamber 102, passes through the through-holes 216 and then through the connecting pipes 218, then exits from the through-holes 217, and eventually flows down toward the silicon wafer 101.

The cooling gas supplied from the cooling gas supply path 105 shown in FIG. 1, on the other hand, passes through between the two flat plates 214 and 215 and exits into the first exhaust pipe 106. In this construction, the space between the two flat plates 214 and 215 is filled with the cooling gas, ensuring that the entire distributor plate 204 is effectively cooled. Especially, since the cooling gas directly cools the periphery of the connecting pipes 218, which serve as flow paths for the reactive gas, the temperature rise of the reactive gas is effectively reduced. Further, this cooling can be effective regardless of on which side of the distributor plate 204 the heat source is located, as in the first embodiment.

The reactive gas that has flowed down through the distributor plate 204 to the silicon wafer 101 reacts on the wafer so that a silicon epitaxial film is formed thereon. The reaction product gas and the unreacted reactive gas are then exhausted out of the coating apparatus 100 through the second exhaust pipe 108 provided at the bottom of the chamber 102. On the other hand, the cooling gas that has cooled the distributor plate 204 is discharged into the first exhaust pipe 106. The cooling gas then passes through the opening 109 into the chamber 102 and is quickly exhausted through the second exhaust pipe 108.

The cooling gas can be introduced into the distributor plate 204 at the same time as the reactive gas, or alternatively it may be introduced when the temperature of the distributor plate 204 has reached or exceeded a predetermined temperature. In the latter case, since it is considered that the temperature, or temperature rise, of the distributor plate 204 is proportional to that of the silicon wafer 101, the cooling gas may be introduced when the temperature of the silicon wafer 101 has reached or exceeded a predetermined temperature.

The supply of cooling gas can be shut off at the same time that the supply of reactive gas is shut off, or alternatively it may be shut off when the temperature of the distributor plate 204 (or silicon wafer 101) has fallen below a predetermined temperature.

The cooling gas is introduced at a suitable flow rate and at ambient temperature. Specifically, if the flow rate of cooling gas is too low, the cooling efficiency is reduced. If, on the other hand, the flow rate of cooling gas is too high, the cooling gas flow interferes with the discharge of the reactive gas and the cooling gas is wasted, resulting in increased cost.

The flow rate of the cooling gas may be maintained constant, or alternatively it may be varied in accordance with the temperature of the distributor plate 204 (or silicon wafer 101). Specifically, the flow rate of the cooling gas may be increased when the temperature of the distributor plate 204 (or silicon wafer 101) is equal to or higher than a predetermined temperature; and the flow rate of the cooling gas may be decreased when the temperature of the distributor plate 204 (or silicon wafer 101) is lower than the predetermined temperature. In order to save on the amount of cooling gas used, it is preferable to vary the flow rate of the cooling gas in accordance with the temperature of the distributor plate 204 (or silicon wafer 101).

The distributor plate 204 may be made of quartz to allow the surface temperature of the silicon wafer 101 to be measured by the radiation thermometer 122 disposed at the top of the chamber 102.

Thus, the coating apparatus of the present embodiment is constructed as follows. As described above, a distributor plate is disposed upstream of the silicon wafer relative to the direction of flow of reactive gas. The distributor plate includes two flat plates spaced a predetermined distance from each other and having through-holes therein and also includes connecting pipes connected between these through-holes. The reactive gas passes through the connecting pipes and flows down toward the silicon wafer, while the cooling gas passes through between the two flat plates. This ensures that the entire distributor plate can be effectively cooled and that the temperature rise of the distributor plate can be reduced regardless of the location of the heating means. Further, the distributor plate may be made of quartz so as not to interfere with the measurement by the radiation thermometer.

Third Embodiment

Figure 6:
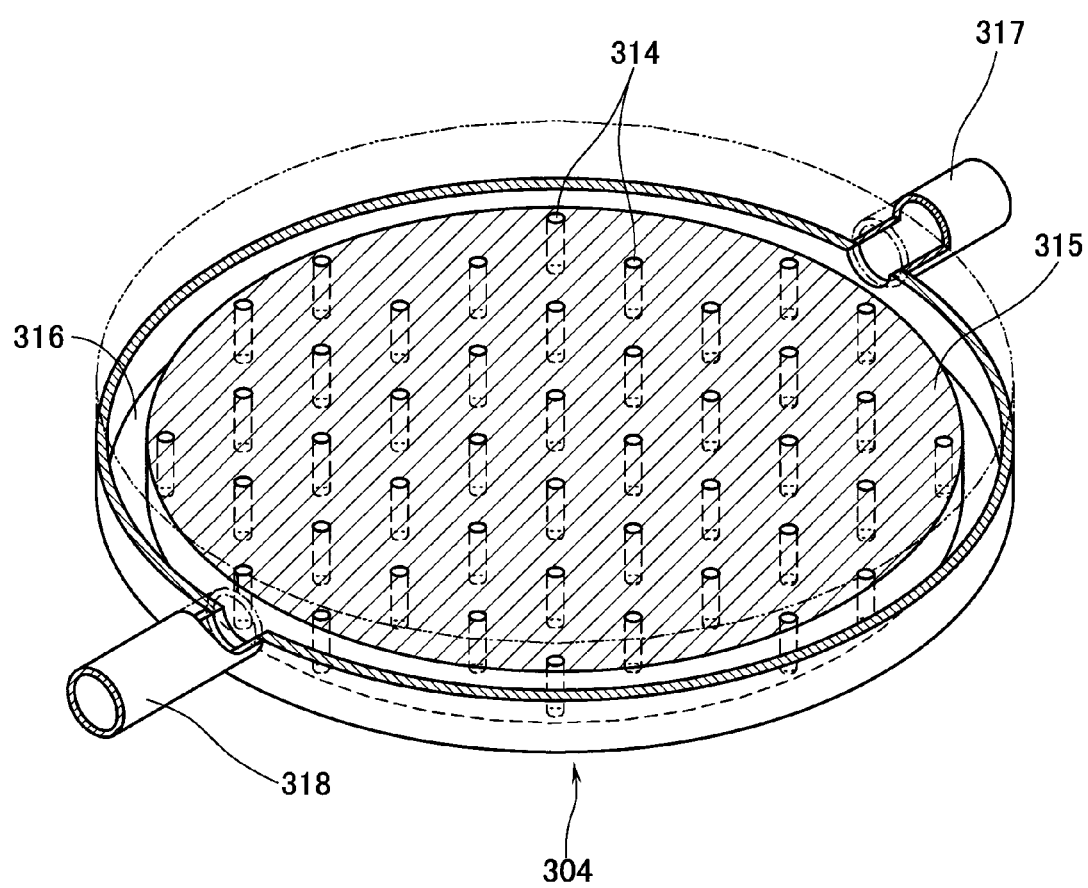
FIG. 6 is a perspective cross-sectional view of a distributor plate according to a third embodiment of the invention.

FIG. 6 is a perspective cross-sectional view of a distributor plate according to a third embodiment of the present invention. It should be noted that the configuration and components of the coating apparatus described below except for the distributor plate may be similar to those shown in FIG. 1 described in connection with the first embodiment.

The distributor plate (304) of the present embodiment is disposed upstream of the silicon wafer 101 relative to the direction of flow of reactive gas (indicated by arrows in FIG. 1).

As shown in FIG. 6, the distributor plate 304 includes a first portion 315 having a plurality of through-holes 314 therein and a hollow second portion 316 disposed along the periphery of the first portion 315. Referring now to FIG. 1, the reactive gas supplied from the reactive gas supply path 103 enters the chamber 102, passes through the through-holes 314, and flows down toward the silicon wafer 101.

The cooling gas supplied from the cooling gas supply path 105 shown in FIG. 1, on the other hand, enters the second portion 316 through a connecting portion 317. The cooling gas then flows along the periphery of the first portion and exits through a connecting portion 318 into the first exhaust pipe 106. This cooling can be effective regardless of on which side of the distributor plate 304 the heat source is located although the cooling structure simply includes a cooling gas flow path encircling the reactive gas flow paths.

The reactive gas that has flowed down through the distributor plate 304 to the silicon wafer 101 reacts on the wafer so that a silicon epitaxial film is formed thereon. The reaction product gas and the unreacted reactive gas are then exhausted out of the coating apparatus 100 through the second exhaust pipe 108 provided at the bottom of the chamber 102. On the other hand, the cooling gas that has cooled the distributor plate 304 is discharged into the first exhaust pipe 106 through the connecting portion 318. The cooling gas then passes through the opening 109 into the chamber 102 and is quickly exhausted through the second exhaust pipe 108.

The cooling gas can be introduced into the distributor plate 304 at the same time as the reactive gas, or alternatively it may be introduced when the temperature of the distributor plate 304 has reached or exceeded a predetermined temperature. In the latter case, since it is considered that the temperature, or temperature rise, of the distributor plate 304 is proportional to that of the silicon wafer 101, the cooling gas may be introduced when the temperature of the silicon wafer 101 has reached or exceeded a predetermined temperature.

The supply of cooling gas can be shut off at the same time that the supply of reactive gas is shut off, or alternatively it may be shut off when the temperature of the distributor plate 304 (or silicon wafer 101) has fallen below a predetermined temperature.

The cooling gas is introduced at a suitable flow rate and at ambient temperature. Specifically, if the flow rate of cooling gas is too low, the cooling efficiency is reduced. If, on the other hand, the flow rate of cooling gas is too high, the cooling gas flow interferes with the discharge of the reactive gas and the cooling gas is wasted, resulting in increased cost.

The flow rate of the cooling gas may be maintained constant, or alternatively it may be varied in accordance with the temperature of the distributor plate 304 (or silicon wafer 101). Specifically, the flow rate of the cooling gas may be increased when the temperature of the distributor plate 304 (or silicon wafer 101) is equal to or higher than a predetermined temperature; and the flow rate of the cooling gas may be decreased when the temperature of the distributor plate 304 (or silicon wafer 101) is lower than the predetermined temperature. In order to save on the amount of cooling gas used, it is preferable to vary the flow rate of the cooling gas in accordance with the temperature of the distributor plate 304 (or silicon wafer 101).

The distributor plate 304 may be made of quartz to allow the surface temperature of the silicon wafer 101 to be measured by the radiation thermometer 122 disposed at the top of the chamber 102.

Thus, the coating apparatus of the present embodiment is constructed as follows. As described above, a distributor plate is disposed upstream of the silicon wafer relative to the direction of flow of reactive gas. The distributor plate includes a first portion having a plurality of through-holes therein and a hollow second portion disposed along the periphery of the first portion. The reactive gas passes through the through-holes and flows down toward the silicon wafer, while the cooling gas passes through the second portion. This ensures that the temperature rise of the distributor plate can be reduced, although the cooling structure is simple.

It is to be understood that the present invention is not limited to the embodiments described above, and that various changes and modifications may be effected therein without departing from the spirit and scope of the invention. For example, although the coating apparatuses of the first to third embodiments have been described with reference to epitaxial growth apparatuses, it is to be understood that the invention is not limited to these particular apparatuses, but can be applied to any coating apparatus in which a film is formed on the surface of a substrate placed in the coating chamber by supplying a reactive gas to the inside of the coating chamber and heating the substrate.

The features and advantages of the present invention may be summarized as follows.

The present invention provides a coating apparatus and coating method capable of forming a film on any suitable type of wafer while minimizing the temperature variation across the wafer.

Thus, the first aspect of the present invention provides a coating apparatus constructed such that the measurement of the wafer temperature is facilitated and the temperature rise of the distributor plate is sufficiently reduced.

The second aspect of the invention also provides a coating apparatus constructed such that the measurement of the wafer temperature is facilitated and the temperature rise of the distributor plate is sufficiently reduced.

The third aspect of the invention provides a coating apparatus which has a simple structure, yet in which the temperature rise of the distributor plate is reduced.

The fourth aspect of the invention provides a coating method capable of forming a film while sufficiently reducing the temperature rise of the distributor plate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-191286, on Jul. 24, 2008 including specification, claims, drawings and summary, on which the Convention priority of the present application is based, are incorporated herein by reference in its entirety.

What is claimed is:

1. A coating apparatus in which a film is formed on a surface of a substrate placed in a coating chamber by supplying a reactive gas to inside the coating chamber and heating the substrate, said coating apparatus comprising:
   a coating chamber;
   a first flow path connected to the top of the coating chamber and configured to supply the reactive gas without mixing with a cooling gas to the coating chamber;
   a distributor plate disposed within the coating chamber such that reactive gas supplied from the first flow path impinges on the distributor plate, and further disposed upstream of the substrate relative to a direction of flow of the reactive gas;
   the distributor plate having therein:
      a first through-hole configured to pass the reactive gas down toward the substrate; and
      a second through-hole configured to pass the cooling gas through the inside of the distributor plate, the first through-hole arranged so as not to meet the second through-hole;
   a second flow path configured to supply the cooling gas to the second through-hole of the distributor plate;
   a third flow path configured to receive the cooling gas discharged from the distributor plate and to introduce the cooling gas into the coating chamber; and
   a fourth flow path configured to exhaust the cooling gas together with the reactive gas from the coating chamber, the cooling gas having been introduced from the third flow path into the coating chamber.

2. The coating apparatus as claimed in claim 1, further comprising:
   a temperature measuring device configured to measure the temperature of the substrate; and
   a controller configured to cause the flow of the cooling gas to be directed either through only the first flow path or through both first and second flow paths, depending on the temperature measured by the temperature measuring device.

3. A coating apparatus in which a film is formed on a surface of a substrate placed in a coating chamber by supplying a reactive gas to inside the coating chamber and heating the substrate, said coating apparatus comprising:
   a coating chamber;
   a first flow path connected to the top of the coating chamber and configured to supply the reactive gas without with a cooling gas to the coating chamber;
   a distributor plate disposed within the coating chamber such that reactive gas supplied from the first flow path impinges on the distributor plate, and further disposed upstream of the substrate relative to a direction of flow of the reactive gas;
   the distributor plate including two flat plates and a connecting pipe, the two flat plates having through-holes therein and being spaced a predetermined distance from each other, the connecting pipe being connected between the through-holes, wherein the connecting pipe is configured to pass the reactive gas through the inside of the connecting pipe to flow down toward the substrate, and the two flat plates are configured to pass the cooling gas between the two flat plates;
   a second flow path configured to supply the cooling gas between the two flat plates of the distributor plate;
   a third flow path configured to receive the cooling gas discharged from the distributor plate and to introduce the cooling gas into the coating chamber; and
   a fourth flow path configured to exhaust the cooling gas together with the reactive gas from the coating chamber, the cooling gas having been introduced from the third flow path into the coating chamber.

4. The coating apparatus as claimed in claim 3, further comprising:
   a temperature measuring device configured to measure the temperature of the substrate; and
   a controller configured to cause the flow of the cooling gas to be directed either through only the first flow path or through both first and second flow paths, depending on the temperature measured by the temperature measuring device.

5. A coating apparatus in which a film is formed on a surface of a substrate placed in a coating chamber by supplying a reactive gas to inside the coating chamber and heating the substrate, said coating apparatus comprising:

a coating chamber;

a first flow path connected to the top of the coating chamber and configured to supply the reactive gas without mixing with a cooling gas to the coating chamber;

a distributor plate disposed within the coating chamber such that reactive gas supplied from the first flow path impinges on the distributor plate, and further disposed upstream of the substrate relative to a direction of flow of the reactive gas and including a first portion having a plurality of through-holes therein and a hollow second portion disposed along a periphery of the first portion, wherein the through-holes are configured to pass the reactive gas through the through-holes to flow down toward the substrate, and the second portion is configured to pass the cooling gas through the hollow second portion;

a second flow path configured to supply the cooling gas to the hollow second portion of the distributor plate;

a third flow path configured to receive the cooling gas discharged from the distributor plate and to introduce the cooling gas into the coating chamber; and a fourth flow path configured to exhaust the cooling gas together with the reactive gas from the coating chamber, the cooling gas having been introduced from the third flow path into the coating chamber.

6. The coating apparatus as claimed in claim 5, further comprising:

a temperature measuring device configured to measure the temperature of the substrate; and a controller configured to cause the flow of the cooling gas to be directed either through only the first flow path or through both first and second flow paths, depending on the temperature measured by the temperature measuring device.

* * * * *

UNITED STATES PATENT AND TRADEMARK OFFICE
CERTIFICATE OF CORRECTION

PATENT NO. : 8,632,634 B2  
APPLICATION NO. : 12/508012  
DATED : January 21, 2014  
INVENTOR(S) : Moriyama et al.

Page 1 of 1

It is certified that error appears in the above-identified patent and that said Letters Patent is hereby corrected as shown below:

In the Claims

Claim 3, column 10, line 37, change "without with" to --without mixing with--.

Signed and Sealed this
Twentieth Day of May, 2014

Michelle K. Lee
*Deputy Director of the United States Patent and Trademark Office*